United States Patent
Wang et al.

(10) Patent No.: US 6,981,234 B2
(45) Date of Patent: Dec. 27, 2005

(54) METHOD OF ITO LAYOUT TO MAKE IC BEAR THE HIGH-VOLT ELECTROSTATIC DISCHARGE

(75) Inventors: Hsing-Fa Wang, Taichung (TW); Ming-Chuan Lin, Taichung (TW)

(73) Assignee: Wintek Corporation, Taichung (TW)

( * ) Notice: Subject to any disclaimer, the term of this patent is extended or adjusted under 35 U.S.C. 154(b) by 163 days.

(21) Appl. No.: 10/304,736

(22) Filed: Nov. 27, 2002

(65) Prior Publication Data

US 2004/0103385 A1    May 27, 2004

(51) Int. Cl.[7] ............................................. G06F 17/50
(52) U.S. Cl. ............................... 716/10; 716/5; 716/14
(58) Field of Search .................. 716/8–14; 345/87–89; 349/39, 40, 151; 257/59; 438/30, 119; 361/736, 361/739, 534, 760, 779

(56) References Cited

U.S. PATENT DOCUMENTS

| | | | |
|---|---|---|---|
| 5,559,614 A * | 9/1996 | Urbish et al. .................. 349/21 |
| 5,949,502 A * | 9/1999 | Matsunaga et al. ........... 349/40 |
| 6,040,812 A * | 3/2000 | Lewis ........................... 345/89 |
| 6,437,764 B1 * | 8/2002 | Suzuki et al. .................. 345/87 |
| 6,525,342 B2 * | 2/2003 | Amemiya et al. ............. 257/59 |
| 6,680,761 B1 * | 1/2004 | Greene et al. ................. 349/73 |
| 2002/0044329 A1 * | 4/2002 | Shoji ........................... 359/245 |
| 2002/0047982 A1 * | 4/2002 | Sonoda et al. ................ 349/177 |
| 2003/0107565 A1 * | 6/2003 | Libsch et al. ................ 345/211 |
| 2003/0107696 A1 * | 6/2003 | Song ............................ 349/141 |
| 2004/0055785 A1 * | 3/2004 | Ben-Shalom ................ 174/256 |

OTHER PUBLICATIONS

Kawachi et al., "A Novel Technology for A-SI TFT-LCD's With Buried ITO Electrode Structure," IEEE, Jul. 1994, pp. 1120-1124.*

Harvey et al., "Laser Cutting Thin Films for Solar Panels," IEEE, May 1996, pp. 1.*

Choi et al., "Design of Solar Cell Array Preventing Electrostatic Discharge for Satellite Use," IEEE, Aug. 1997, pp. 416-421.*

Charruau, "Modeling Electrical Conductive of Anisotropic Chemical Adhesives," IEEE, Jun. 23-26, 2002, pp. 7-12.*

Jeng et al., "Application of A1/P1 Composite Bumps to COG Bonding Process," IEEE, Jun. 2001, pp. 271-278.*

Zhang et al., "A Novel Self-Aligned Bidirectional MIM Diode With Transparent Junction of AM-LCD's," IEEE, Jun. 1998, pp. 192-194.*

(Continued)

Primary Examiner—Vuthe Siek
(74) Attorney, Agent, or Firm—Troxell Law Office, PLLC

(57) ABSTRACT

The present invention provides a method of ITO layout to make IC bear the high-volt electro static discharge, wherein the major steps include: designing the suitable circuit impedance and Layout at the position of Driver IC bonding and Interface on LCD Module(COG type) in accordance with the function and use of each pin; improving the protection function of ESD(Electro Static Discharge) in increasing the LCD Module assembly on the product of the client; wherein: connecting the pins of all VDD or VSS together at the bottom of the IC and the width of ITO layout spreading over the bottom of IC without influencing the layout of other pins after connecting VSS or VDD. Discharge the static electricity that enters the position of Module Interface and dissipate the electro static discharge by means of the ITO layout design of the big area to improve the protection ability of IC for the electro static discharge. Serial connect an extremely high impedance(3K~50K Ω) in the Reset Pin. Increase the value (100~1000 Ω) of ITO circuit impedance of Date bus, such as CS1.D/C,WR,RD,D0~D7,C86 etc.

3 Claims, 3 Drawing Sheets

OTHER PUBLICATIONS

Ito et al., "Analysis and Design of Distributed EDS Protection Circuits for High-Speed Mixed-Signal and RF ICs," IEEE, Aug. 2002, pp. 1444-1454.*

Kristiansen et al., "Overview of Conductive Adhesive Interconnection Technologies for LCD's," IEEE, 1997, pp. 223-232.*

* cited by examiner

METHOD OF ITO LAYOUT TO MAKE IC BEAR THE HIGH-VOLT ELECTROSTATIC DISCHARGE

BACKGROUND OF THE INVENTION

1. Field of the Technique

The present invention relates to a method of ITO layout to make IC bear the high-volt electro static discharge.

2. Description of the Prior Art

It is believed that how to use the most simple way to take the shortest time to deliver all kinds of information to the consumers in the era full of information will be paid attention by the consumers, such as the quotation on the stock market or the newest information of consumption available at any time and in any place etc., and the mobile phones, the electronic mechanisms having display screen, are the best medium for the industrial and commercial world to make use in the situation that the utility rates of the mobile phones almost reach the level of everyone having a mobile phone; however, those who are skilled in this art know that the major reason why the display screen of the mobile phone can show all kinds of information is the combination of an IC connecting with its display screen and the circuit constituted by ITO layout and the relative micro-electronics elements.

The application of the conventional ITO circuit to the mobile phone is favorable for the industrial and commercial world to deliver large complicated informations by means of the mobile phones because the conventional ITO circuit has good electric conductivity and is advantageous to be processed on the glass. But, due to the conventional design of ITO layout in LCD MODULE, it is necessary to greatly improve LCD MODULE(COG type) for the high-volt electro static discharge, which is on account of the drawback that LCD MODULE's unable to bear the high-volt electro static discharge causes the action of the screen on the mobile phone extraordinary. Although one of the solutions is to add capacitors or antistatic elements on the glass, in addition to the limited applicable space, the fairly complicated process and the high cost are also the drawbacks. The first of all developments in the relative industries is how to improve the protection function of ESD (Electro Static Discharge) in increasing the LCD Module assembly on the product of the client and designing the circuits which make LCD Driver IC be able to resist the high-volt static voltage in accordance with the property of the electronic component.

The inventor of the present application longed for improving and innovating in view of every drawback derived from the above conventional electronic circuit, made extraordinarily painstaking efforts to devote himself to the study of science many years, and achieved this method of ITO Layout to make IC bear the high-volt electro static discharge finally.

SUMMARY OF THE INVENTION

The object of the present invention is to provide a method of ITO layout to make IC bear the high-volt electro static discharge. The major steps of a method of ITO layout to make IC bear the high-volt electro static discharge which is provided by the present invention, include: designing the suitable circuit impedance and Layout at the position of Driver IC bonding and Interface on LCD Module (COG type) in accordance with the function and use of each pin; improving the protection function of ESD (Electro Static Discharge) in increasing the LCD Module assembly on the product of the client.

The major steps of a method of ITO layout to make IC bear the high-volt electro static discharge, which can reach the above objects of the invention, include: designing the suitable circuit impedance and Layout at the position of Driver IC bonding and Interface on LCD Module (COG type) in accordance with the function and use of each pin; improving the protection function of ESD (Electro Static Discharge) in increasing the LCD Module assembly on the product of the client; wherein: connecting the pins of all VDD or VSS at the bottom of the IC and the width of ITO layout spreading over the bottom of IC after connecting VSS or VDD without influencing the layout of other pins. Discharge the static electricity that enters the position of Module Interface and dissipate the static electricity by means of the ITO layout design of the big area to improve the protection ability of IC for the electro static discharge. Serial connect an extremely high impedance (3K~50KΩ) in the Reset Pin. Increase the impedance (100~1000 Ω) of ITO circuit of Date bus, such as CS1.D/C,WR,RD,D0~D7,C86 etc.

BRIEF DESCRIPTION OF THE DRAWINGS

Please refer to the detail description and the drawings thereinafter with regard to a preferred embodiment of the present invention and the technique content, the object and the function of the present invention will be further understood.

DETAILED DESCRIPTION OF THE PREFERRED EMBODIMENT

Figure 1:
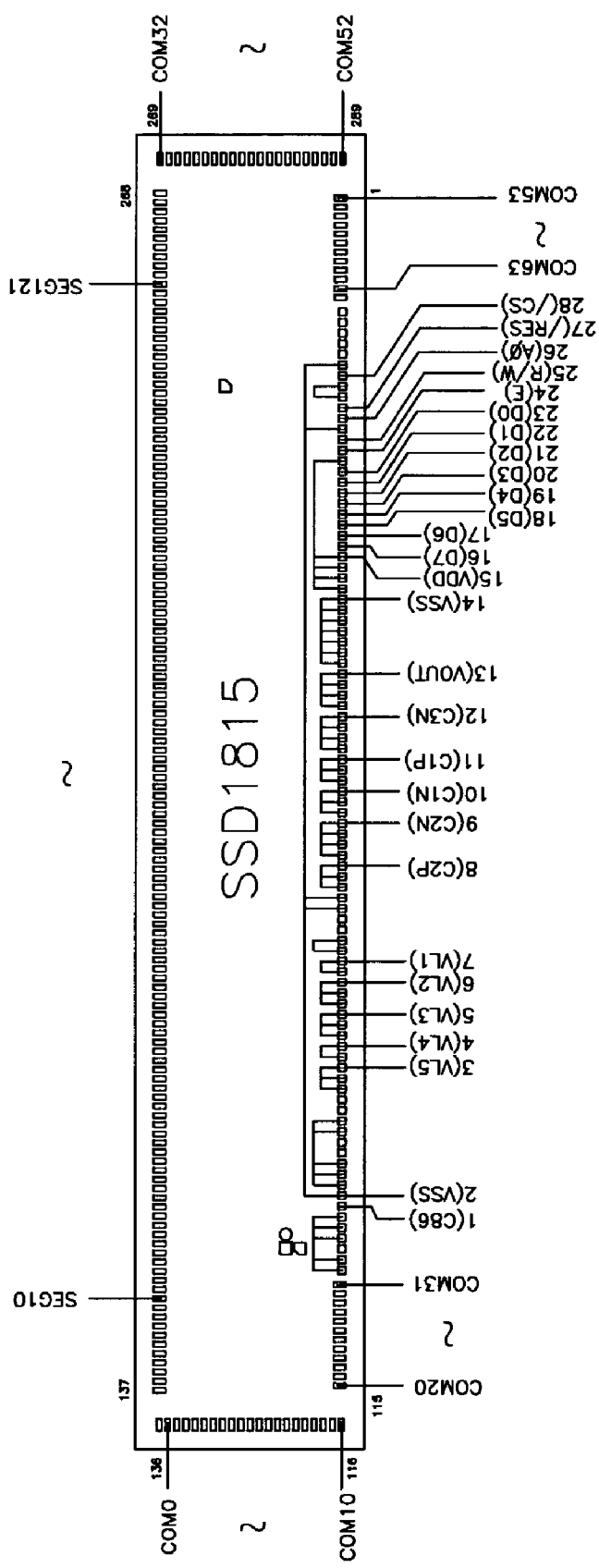
FIG. 1 is the schematic diagram of ITO layout of DRIVER IC in LCD MODULE in the present invention.
Figure 2:
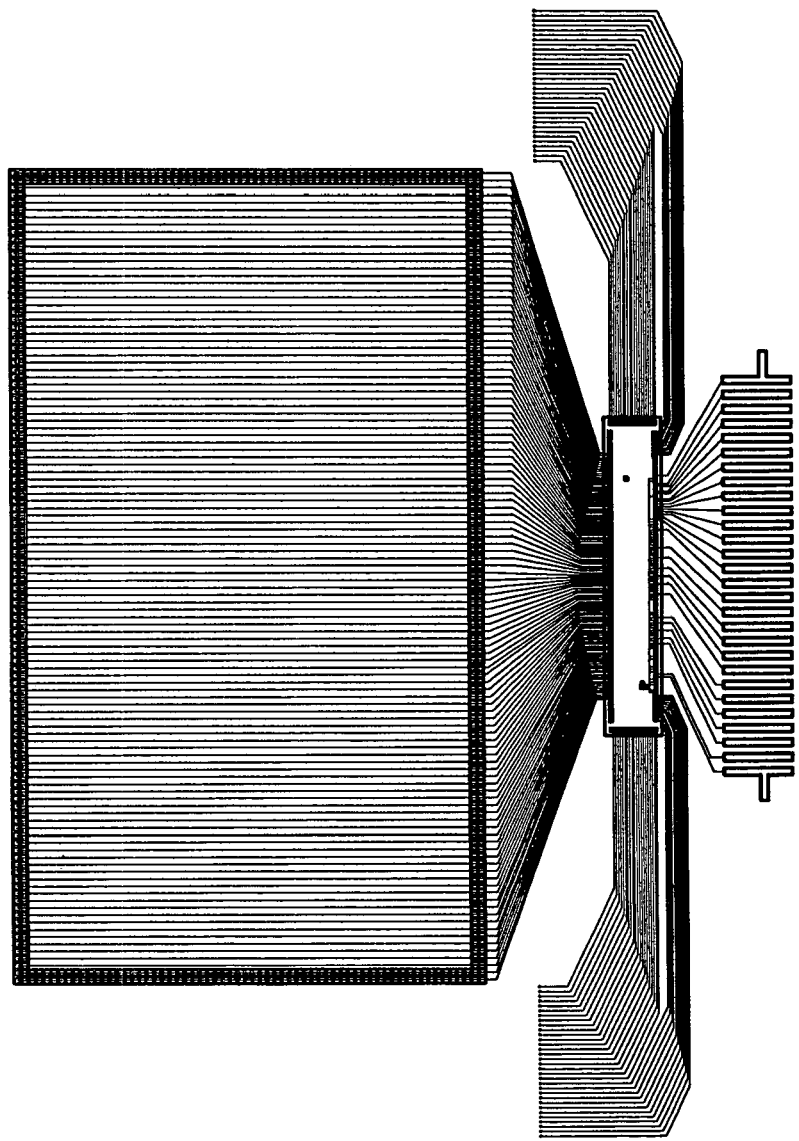
FIG. 2 is the schematic diagram of ITO layout in the conventional way, which is the regular width of the interface pin.
Figure 3:
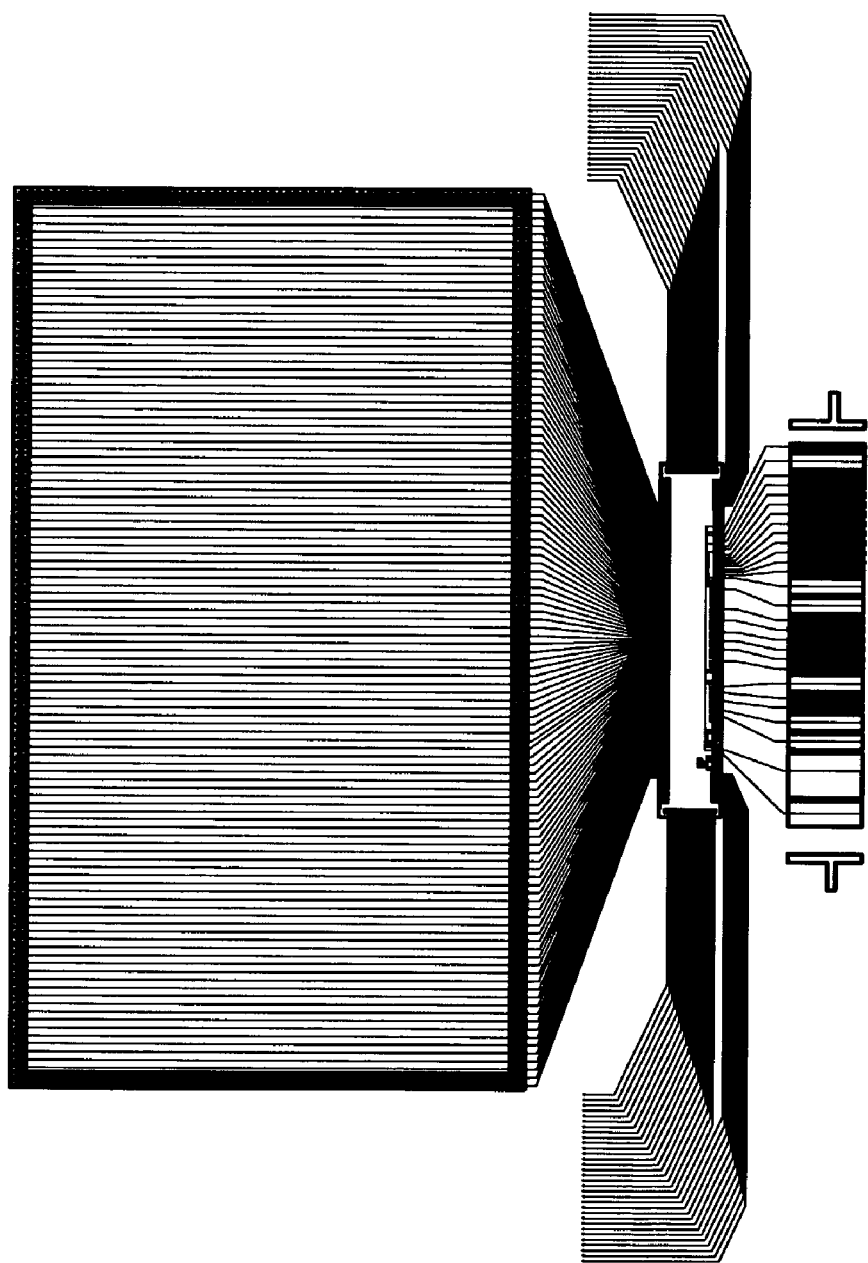
FIG. 3 is the schematic diagram of ITO layout in the present invention, and the different ITO circuit impendence and layout are designed in accordance with the function and use of each interface pin.

Please refer to FIG. 3. The major steps of a method of ITO layout to make IC bear the high-volt electro static discharge which is provided by the present invention, include:

1. designing the suitable circuit impedance and Layout at the position of Driver IC bonding and Interface on LCD Module (COG type) in accordance with the function and use of each pin; improving the protection function of ESD (Electro Static Discharge) in increasing the LCD Module assembly on the product of the client; wherein:
2. connecting the pins of all VDD or VSS together at the bottom of the IC and the width of ITO layout spreading over the bottom of IC after connecting VSS or VDD without influencing the layout of other pins;

Discharging the static electricity that enters the position of Module Interface and dissipating the static electricity by means of the ITO layout design of the big area to improve the protection ability of IC for the electro static discharge;

3. serial connecting an extremely high impedance (3K~50KΩ) in the Reset Pin;

4. increasing the impedance value (100~1000 Ω) of ITO circuit of Date bus, such as CS1.D/C,WR,RD,D0~D7, C86 etc.

The potential and function of every symbol in the drawing is such as that shown in Table 1:

| NO | SYMBOL | LEVEL | FUNCTION |
|---|---|---|---|
| 1 | C86 | Input | MCU parallel interface selection input |
| 2 | VSS | Low | Ground. A reference for the logic pins |
| 3 | V5 | Supply | The most negative LCD |
| 4 | V4 | Supply | The LCD driving voltage levels. |
| 5 | V3 | Supply | The LCD driving voltage levels. |
| 6 | V2 | Supply | The LCD driving voltage levels. |
| 7 | V1 | Supply | The LCD driving voltage levels. |
| 8 | CAP2+ | Output | When internal DC-DC voltage converter is used. |
| 9 | CAP2− | Output | When internal DC-DC voltage converter is used. |
| 10 | CAP1− | Output | When internal DC-DC voltage converter is used. |
| 11 | CAP1+ | Output | When internal DC-DC voltage converter is used. |
| 12 | CAP3− | Output | When internal DC-DC voltage converter is used. |
| 13 | VOUT | I/O | The most negative voltage supply pin of the chip. |
| 14 | VSS | Low | Ground. A reference for the logic pins. |
| 15 | VDD | High | Chip's Power Supply pin. |
| 16 | D7 | H/L | Data bus to be connected to the MCU. |
| 17 | D6 | H/L | Data bus to be connected to the MCU. |
| 18 | D5 | H/L | Data bus to be connected to the MCU. |
| 19 | D4 | H/L | Data bus to be connected to the MCU. |
| 20 | D3 | H/L | Data bus to be connected to the MCU. |
| 21 | D2 | H/L | Data bus to be connected to the MCU. |
| 22 | D1 | H/L | Data bus to be connected to the MCU. |
| 23 | D0 | H/L | Data bus to be connected to the MCU. |
| 24 | /RD,E | I/O | The MCU interface input. |
| 25 | /WR,R/W | I/O | The MCU interface input. |
| 26 | A0 | Input | Data/Command control pin. |
| 27 | /RES | Input | Reset signal input. |
| 28 | /CS1 | Input | The chip select input. |

Comparing a method of ITO layout making IC bear the high-volt electro static discharge, which is provided by the present invention, with the other conventional art, the present invention discharges the static electricity which enters IC by means of ITO layout's spreading over the bottom of IC according to the special area-distribution function and cooperating the design of the impedance in the special exit-pin, and dissipate the static electricity effectively or isolate part of the static electricity at the position of Module Interface by means of the special design of ITO layout. The present invention improves the protection ability of IC for the electro static discharge and doesn't add the additional capacitor or the antistatic element to reduce the cost effectively. It also improves the protection function of ESD (Electro Static Discharge) in increasing the LCD Module assembly on the product of the client.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A method for manufacturing an indium tin oxide (ITO) layout for a chip on glass (COG) integrated chip (IC) comprising:
    a) designing a circuit impedance and layout at a position of a driver IC bonding and a module interface on a liquid crystal display (LCD) according to a function and use of each of a plurality of pins of one of a VDD and a VSS;
    b) connecting the plurality of pins to the circuit impedance and layout at a bottom of the IC, the circuit impedance and layout extending across the bottom of the IC; and
    c) discharging and dissipating static electricity that enters the module interface utilizing the circuit impedance and layout.

2. The method according to claim 1, further comprising the step of serially connecting a reset pin with the circuit impedance and layout and increasing an impedance to a range between 100Ω and 1000Ω.

3. The method according to claim 1, further comprising the step of increasing an impedance of the circuit impedance and layout to a range between 3KΩ and 50KΩ utilizing a data bus selected from a group consisting of CS1. D/C, WR, RD, D0, D1, D2, D3, D4, D5, D6, D7, and C86.

* * * * *